United States Patent [19]

Araihara

[11] 4,402,600
[45] Sep. 6, 1983

[54] PHOTOMASK FOR PRODUCING SEMICONDUCTOR DEVICES

[75] Inventor: Satoshi Araihara, Kawasaki, Japan

[73] Assignee: Fujitsu Limited, Kawasaki, Japan

[21] Appl. No.: 314,429

[22] Filed: Oct. 23, 1981

[30] Foreign Application Priority Data

Oct. 31, 1980 [JP] Japan .............................. 55-156206[U]

[51] Int. Cl.³ ............................................. G03B 27/28
[52] U.S. Cl. ........................................ 355/125; 355/30
[58] Field of Search ....................... 355/125, 30, 91, 92; 354/4

[56] References Cited

U.S. PATENT DOCUMENTS 3,507,593  4/1970  McTeague .......................... 355/91 X
3,811,893  5/1974  Jannssen et al. .................. 355/125 X

*Primary Examiner*—Richard A. Wintercorn
*Attorney, Agent, or Firm*—Staas & Halsey

[57] ABSTRACT

A photomask comprises a transparent substrate on one surface of which a mask pattern is formed of a photo-shielding film and the opposite surface of which is roughened in order that rays of incident light are refracted diffusedly through the rough surface and the images of minute particles of dust disappear in the projected pattern.

12 Claims, 2 Drawing Figures

Fig. 1
Fig. 2
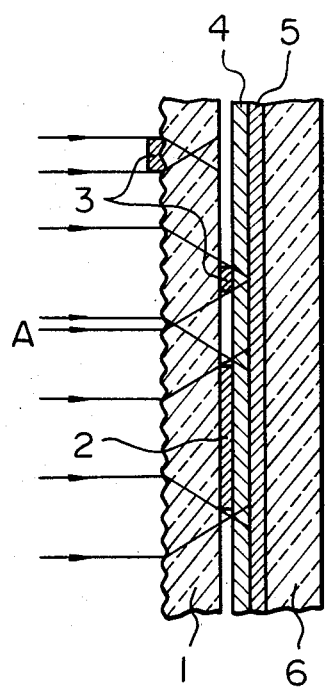
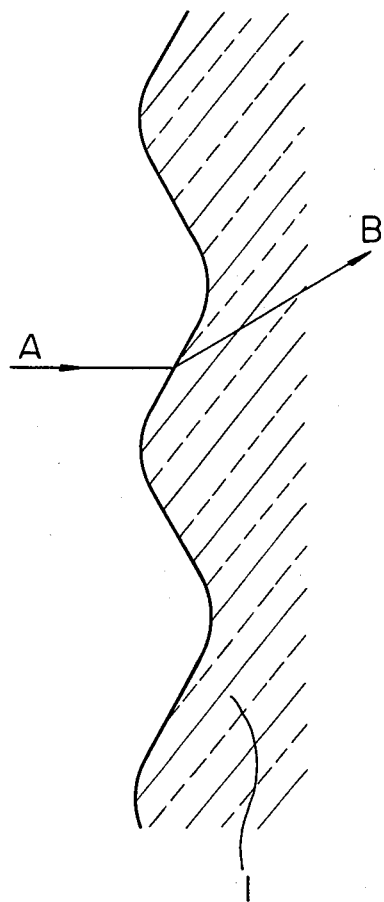

PHOTOMASK FOR PRODUCING SEMICONDUCTOR DEVICES

FIELD OF THE INVENTION

The present invention relates to an improved photomask for producing semiconductor devices.

BACKGROUND ART

A series of photoprocesses are used in producing semiconductor devices. Firstly, a mastermask is produced by making reduced copies of reticle patterns, by reducing each pattern to one tenth of its original size. Secondly, a copymask is produced by inversely projecting the pattern of the mastermask. Then, the pattern on the mask is transferred onto a photoresist layer which has been applied on a plain metal layer on a surface of a semiconductor substrate.

A mastermask and a copymask each comprise a transparent substrate, e.g. glass or silica, on which a mask pattern is formed of a metallic film, e.g. chromium, or a metal oxide film, e.g. chromium oxide. The contact exposure technique is commonly used in transferring the pattern from a mask, i.e., light irradiated from the back surface of a mask passes to the plain surface of a photoresist layer to be patterned, where the surface of the photoresist and that of the patterned mask make close contact with each other. However, minute particles of dust of several μm unavoidably adhere to the surface of the transparent substrate of the mask.

During the time of contact exposure, images of the minute particles of dust are transferred together with the mask pattern onto the plain surface to be patterned. Thus, the transferred images of the minute particles of dust result in forming pin holes in the metal conductor when a negative type photoresist is used, and undesired residues of metal are deposited between the pattern designs, when a positive type photoresist is used, leading to disconnection and short circuiting of the metal conductor.

SUMMARY OF THE INVENTION

It is a general object of the present invention to provide a photomask, by which exact patterns are formed on a semiconductor device without being disturbed by minute particles of dust.

According to the present invention, there is provided a photomask comprising a transparent substrate, on one surface of which a mask pattern is formed of a photoshielding film, characterized in that the opposite surface to the one surface provided with said mask pattern has been roughened in order that the incident light is refracted diffusedly through this rough surface.

The roughness of the surface is preferably from 1 μm to 50 μm. If the roughness is greater than 50 μm, it becomes difficult to obtain a sharp transferred pattern, and practically the roughness is larger than 1 μm.

These together with other objects and advantages which will become subsequently apparent reside in the details of construction and operation as more fully hereinafter described and claimed, reference being had to the accompanying drawings forming a part hereof, wherein like numerals refer to like parts throughout.

BRIEF DESCRIPTION OF THE DRAWINGS

FIG. 1 is a diagrammatic cross-section of the present invention;

FIG. 2 is a pictorial side elevational view of the method of operation of the present invention.

DESCRIPTION OF THE BEST MODE FOR CARRYING OUT THE INVENTION

FIG. 1 is a diagrammatic section illustrating a photomask of the present invention with a substrate to be patterned.

A photomask consisting of a glass substrate 1 with a thickness of 2.5 mm is provided, one surface of which has been previously made uneven by sandblasting, the unevenness ranging from 1 to 50 μm. On the other surface of glass substrate 1 patterned chromium 2 has been formed 0.1 μm in thickness and 11.6 μm in width. Minute particles of dust 3 of several μm are show deposited on both surfaces of the substrate 1.

Rays of light incident to the uneven surface of the substrate 1 are refracted diffusedly, as shown in enlarged side elevation in FIG. 2. Because of this diffused refraction the images of the particles of dust 3 almost completely disappeared from the photoresist layer 4 applied on the aluminum layer 5 of the plain silicon substrate 6. However, the image of the patterned chromium 2 was clearly transferred onto the photoresist layer 4 but, having its width slightly increased to 11.8 μm.

In addition, it has been proved that the light energy necessary for exposure increased on the order of 10%, in comparison with the case of the prior art photomask, and was sufficient to obtain substantially the same clear pattern as that obtained through the prior art photomask. The exposure time required at most is only from 1 to 2 seconds more than the known prior art. Therefore, the present invention exhibits practically similar easiness in the photoprocess technique for producing semiconductor devices.

The present invention provides a photomask capable of transferring an exact mask pattern without projecting the images of minute particles of dust and, thus, improves the yield and the reliability of the produced semiconductor devices.

In the above-mentioned example the present invention was applied to a copymask; however, it should be readily understood that the invention can be advantageously applied to a mastermask and, thus, an exact copymask can be produced.

I claim:

1. A photomask comprising a transparent substrate on one surface of which a mask pattern is formed of a photoshielding film characterized in that the opposite surface to said one surface provided with said mask pattern is roughened in order that rays of incident light from said opposite surface side toward said one surface side are refracted diffusedly through said rough surface.

2. An improved photomask comprising:
 a transparent substrate;
 means on one surface of said transparent substrate for providing a photo-shielding pattern; and
 further means on the other surface of said transparent substrate for effecting diffusion of rays of light directed from said other surface to said one surface so that contaminant particles on the substrate will not appear on a surface to be patterned.

3. An improved photomask comprising:
 a transparent substrate;
 a photo-shielding film on one surface of said transparent substrate for providing a photo-shielding pattern; and further means on the other surface of said transparent substrate for effecting diffusion of rays of light directed thereon so that contaminant particles will not appear on a surface to be patterned.

4. An improved photomask as set forth in claim 3, wherein said photo-shielding film consists of chromium.

5. An improved photomask as set forth in claim 3, wherein said photo-shielding film consists of chromium oxide.

6. An improved photomask as set forth in claim 3, wherein said further means for effecting light ray diffusion on the other surface of said transparent substrate comprises said other surface being roughened.

7. An improved photomask as set forth in claim 6, wherein said other surface is roughened less than 50 $\mu$m.

8. An improved photomask as set forth in claim 6, wherein said other surface is roughened more than 1 $\mu$m.

9. An improved photomask as set forth in claim 6, wherein said other surface is roughened between 1 $\mu$m and 50 $\mu$m.

10. An improved photomask as set forth in claim 2, wherein said further means comprises said other surface being roughened less than 50 $\mu$m.

11. An improved photomask as set forth in claim 2, wherein said further means comprises said other surface being roughened more than 1 $\mu$m.

12. An improved photomask as set forth in claim 2, wherein said further means comprises said other surface being roughened between 1 $\mu$m and 50 $\mu$m.

* * * * *